United States Patent [19]

Baum et al.

[11] Patent Number: 5,023,833

[45] Date of Patent: Jun. 11, 1991

[54] FEED FORWARD NEURAL NETWORK FOR UNARY ASSOCIATIVE MEMORY

[75] Inventors: Eric B. Baum, Pasadena, Calif.; John E. Moody, New Haven, Conn.; Frank A. Wilczek, Cambridge, Mass.

[73] Assignee: California Institute of Technology, Pasadena, Calif. ; by said Eric B. Baum

[21] Appl. No.: 130,207

[22] Filed: Dec. 8, 1987

[51] Int. Cl.$^5$ ............................................. G11C 15/00
[52] U.S. Cl. ....................................... 365/49; 364/900; 371/36
[58] Field of Search ................. 365/49; 364/900, 200, 364/807, 211, 749, 322, 766, 530, 160, 724, 560; 307/201, 464; 371/36, 43

[56] References Cited

U.S. PATENT DOCUMENTS

| | | | |
|---|---|---|---|
| 4,559,618 | 12/1985 | Houseman et al. | 365/49 |
| 4,660,166 | 4/1987 | Hopfield | 364/131 |
| 4,694,425 | 9/1987 | Imel | 365/49 |
| 4,740,917 | 4/1988 | Denis et al. | 365/49 |
| 4,807,168 | 2/1989 | Moopenn et al. | 365/49 |

OTHER PUBLICATIONS

J. Denker (ed) "Neural Networks for Computing" AIP Conference Proceedings 151, 1986, Snowbird Utah, American Inst. of Physics, NY pp. 1-442.
Lippman, "An Introduction to Computing with Neural Networks" IEEE ASSP Magazine, Apr. 1987, pp. 1-541.
H. L. McLelland, D. E. Rumelhart, The PDP Research Group (eds)(1986) "Parallel Distributed Processing: Exploration in the Microstructure of Cognition", MIT Books Press/Bradford Books, Cambridge MA pp. 3-546. Updated Edition, pp. 1-609, vol. 2: Psychological and Biological Models.
T. Kohonen (1984) "Self-Organization and Associative Memory", Springer-Verlag, Berlin; Springer Series in Information Sciences, pp. 2-267.
G. E. Hinton, J. E. Anderson (eds) (1981) "Parallel Models of Associative Memory", Lawrence Erlbaum Associates Inc. Hillsdale N.J., The Cognitive Science Series. pp. 1-338.

Primary Examiner—Terrell W. Fears
Attorney, Agent, or Firm—Antonio M. Fernandez

[57] ABSTRACT

Feed forward neural network models for associative content addressable memory utilize a first level matrix of resistor connections to store words and compare addressing cues with the stored words represented by connections of unit resistive value, and a winner-take-all circuit for producing a unary output signal corresponding to the word most closely matched in the first matrix. The unary output signal is converted to a binary output code, such as by a suitable matrix. Cues are coded for the address input as binary $1 = +V$, binary $0 = -V$, and unknown $= 0V$. Two input amplifiers are employed with two input conductors for each input bit position, one noninverting and the other inverting, so that the winner-take-all circuit at the output of the first matrix may be organized to select the highest number of matches with stored words as the unary output signal. By inverting the cues at the input to the first matrix, and inverting the output of the first level matrix, the effect of resistor value imprecision in the first matrix is virtually obviated. By space coding, the first and second matrices may be expanded into multiple sets of matrices, each with its own winner-take-all circuit for producing unary output signals applied from the first set to the second set of matrices. The output conductors of the second set of matrices are grouped to provide a sparse output code that is then converted to a binary code corresponding to the word recalled.

11 Claims, 5 Drawing Sheets

FEED FORWARD NEURAL NETWORK FOR UNARY ASSOCIATIVE MEMORY

BACKGROUND OF THE INVENTION

This invention relates to both associative and content-addressable memories (ACAMs) which utilize the "neural network" concepts of threshold logic, current summations, and resistive connections for decisional operation.

A memory is content addressable if it allows recall of a stored word without reference to the physical location where the word is stored. In other words, addressing is based on semantic content, not the hardware of storage. An associative memory allows recall based on only partial, or partially erroneous information. In contrast, standard computer memories require complete knowledge of a specific address for retrieval.

ACAMs have numerous potential practical applications, e.g., for pattern recognition, vector quantization, and associative search. As memories of the human brain are associative and content-addressable, another use for ACAMs is to provide models for psychology or neurophysiology.

Over the past forty years, a variety of "connectionist" or "neural network" models for associative memories have been studied. See Denker, J. (ed) (1986) Neural Networks for Computing, AIP Conference proceedings 151 (Snowbird, Utah) New York; Hinton, G. E., Anderson, J. E. (eds) (1981) Parallel Models of Associative Memory, Lawrence Erlbaum Associates, Inc., Hillsdale, N. J.; Kohonen, T. (1984) Self-Organization and Associative Memory, Springer-Verlag, Berlin; McLelland, H. L., Rumelhart, D. E. (1986) the PDP Research Group, (eds) (1986) Parallel Distributed Processing: Explorations in the Microstructure of Cognition, MIT Press/Bradford Books, Cambridge, MA; Hopfield, John, U.S. Pat. No. 4,660,166, "Electronic Networks for Collective Decision Based on Large Numbers of Connections Between Signals." In these models, the basic unit is a "neuron" which performs a weighted linear summation of its inputs, and fires if a threshold is exceeded. These models are, of course, inspired by biology—a hardware "neuron" is supposed to embody a simplified human neuron.

A recent surge of interest in connectionist models in part reflects the general exploration of methods for achieving massive parallelism, but more specifically stems from new ideas for their hardware implementation. Although the present invention utilizes some basic principles relevant to connectionist ACAMs, a substantial improvement in the design of such memories is attained.

It should be noted that hardware implementation of connectionist models require high connectivity and, frequently, resistive connections. These features are not available in traditional VLSI circuits, but a number of groups are known to be working toward large-scale implementations of connectionist models with resistive connections. Analog chips with of order $10^3$ fully interconnected neurons ($10^6$ connections) appear to be feasible, these will be comparable in hardware complexity to existing 1 megabit digital RAM chips. Since large digital memory circuits with 16 megabytes of storage capacity are becoming common even for desktop computers, it is possible that analog associative networks with of order $10^8$ connections may be implemented. Such memory capacity is still dwarfed by the human brain, which has of order $10^{14}$ connections.

It is proposed that the simplest ACAM is based on the idea of "one memory, one neuron," so that for each stored word, there is a single neuron whose job it is to recognize that word, and fire when it is presented. Processor neurons of this type are known as grandmother cells, in reference to a hypothetical cell which fires only when a subject sees a specific object, e.g., his grandmother. Sherrington, C. S., Man on His Nature, Cambridge University Press (1941); Barlow, H. B., Perception 1:371 (1972).

For reasons that will become apparent, this sort of ACAM will be refered to hereafter as a unary ACAM. The network consists of three layers: an input layer, an intermediate or processor layer, and an output layer. The input and output layers each have N neurons representing N-bit vectors or words, while the intermediate level has G neurons. There is no feedback to the input as in the Hopfield model. (See U.S. Pat. No. 4,660,166 cited above.)

Considering quantitatively the simplest version, based on 2-state threshold neurons, let $I_i$, $R_j$, $O_k$ be the output value of the ith input, jth intermediate, and kth output neuron respectively; and let $A_i{}^j$, $B_k{}^j$ be matrices representing the strength of connections between input and intermediate, and intermediate and output layers, respectively, in an evident notation. Thus $$R_j = H\left(\sum_{i=1}^{H} A_i{}^j I_i - \theta_j\right) \quad (1)$$

$$O_k = H\left(\sum_{j=1}^{G} B_k{}^j R_j - \theta_k\right)$$

where H is the Heaviside step-function, equal to 1 or 0 according to whether its argument is positive or negative. In general, the neural response function may be any suitable thresholding function, whether smooth such as a sigmoid or discontinuous like the Heaviside step function. One popular sigmoid is the logistic function. The $\theta_j$ and $\theta_k$ are thresholds associated with the $j^{th}$ neuron and $k^{th}$ neuron respectively. These thresholds may be fixed, variable, or dynamically determined.

Now to store M = G N-bit binary words $\epsilon_i{}^\mu$ valued $\pm 1$ ($\mu = 1, \ldots, M$, $l = 1, \ldots N$) simply set $$A_i{}^j = \epsilon_i{}^j, \; B_k{}^j = \epsilon_k{}^j, \quad (2)$$

or in matrix notation $$A = \epsilon^T, \; B = \epsilon. \quad (3)$$

Note that the present discussion will use the $\{+1, -1, 0\}$ data representation. The 0 value corresponds to logical don't know or don't care. Analogous calculations and circuits apply if a $\{1, 0\}$ data representation or a $\{+1, -1\}$ data representation is used instead.

In principle, a stored word may be recovered by presenting b bits with values $\pm 1$, and setting the other input bits to 0, so long as these b bits are enough to uniquely specify the stored word. In this case, the processor neuron representing this word will have input b, and all other processor neurons will have input no greater than $b-2$ so that retrieval may be made by thresholding at $b-1$.

By presenting b known bits corresponding to a particular stored word, and asking that with probability $1-\epsilon$ no other among M random words share these bits, the following relationship is established:

$$b \geq \log_2 M + \log_2(1/\epsilon). \tag{5}$$

To insure that no confusion arises for any word (with the same confidence), the relationship requires $$b \geq 2\log_2 M - 1 + \log_2(1/\epsilon). \tag{6}$$

For a given set of b bits, even $b < \log_2 M$, it may happen that no confusion can arise. This possibility can be exploited by wiring the processor neurons into a winner-take-all circuit which can be implemented, for example, by using lateral inhibition of all neurons having an input less than the neuron having the highest input. Then only the processor neuron with the highest input will turn on. Assuming accurate values for the synapses, this scheme achieves theoretically optimal retrieval in that a stored word is retrieved as soon as sufficient bits are supplied to uniquely specify it. An alternative approach to the winner-take-all implementation is to supply an external threshold voltage to each processor neuron in parallel, and increase or "ramp" the threshold until only one processor neuron is on. This is a preferred approach for $G > 100$. Alternatively, if ambiguous information is presented, it may be valuable to learn that the input bits supplied are shared by two or more standard words. Such information may be obtained either by thresholding or by ramping.

In practice synapses will have finite accuracy. A standard deviation of $\sigma$ in synaptic values, for example, will lead to a signal of order $b \pm \sigma \sqrt{b}$. This is not catastrophic (for small $\sigma$), but does lead to a rise in the number of bits required for retrieval. Similarly, one can retrieve a complete stored word from noisy partial information.

To cope with imprecise connections, the present invention modifies the strategy by looking for mismatches instead of matches. This requires a change in the circuits. In the standard design using input "neurons" as switches, each input cue is connected by an inverting amplifier to one conductor and by a noninverting amplifier to another, similar to the input arrangement of the Hopfield U.S. Pat. No. 4,660,166 cited above, but in a feed forward system instead. Depending upon whether the inverting conductor or the noninverting conductor is connected to the input of a processor neuron, a negative or a positive synapse is normally formed. The present invention proposes to alter this and connect each input to two threshold neurons, one corresponding to the "inverted" conductor having output $H(-I-\frac{1}{2})$, the other corresponding to the "noninverted" conductor having output $H(I-\frac{1}{2})$ where I is the signal value of the input. Thus if $I = +1$, the noninverted neuron has value 1 and the inverted neuron value 0, while if $I = -1$, their values are exchanged, and if $I = 0$, both inverted and noninverted neurons have value 0. Then the synaptic values are written as if the negative of the word were to be stored, and have normal processor neurons which turn on if their input is below a threshold.

The great practical advantage of the inverted logic of the present invention is that through inversion only mismatches between the input bits and the stored bits draw current, so that inaccuracies in the resistors cannot easily lead to an erroneous result. For instance, a triple mismatch will not be mistaken for a double mismatch, so long as the resistor variation is $\leq 33\%$, essentially independent of the number of matching bits.

The unary ACAM makes efficient use of hardware. For hetero-associative memory, the efficiency of the unary network, in terms of the information it can store relative to the hardware requirements, is optimal. The network stores $M \leq G$ words, each containing N bits, at both the input and output stages using only GN binary synapses per stage, where G is the number of neurons (grandmother cells) in the intermediate level, as noted hereinbefore. At full capacity, the storage efficiency defined as information bits/hardware bits becomes 1, the information theoretic bound.

SUMMARY OF THE INVENTION

In accordance with the present invention, an associative content addressable memory (ACAM) is comprised of three operating levels in cascade. In the first level, there is a memory matrix of paired cue input conductors (a,b), one pair for each bit of an N-bit word stored, and a number M of output conductors, one output conductor for each of M data words stored. The cue bits applied to the paired input conductors are coded for each bit addressing a binary word stored as indicated by the following table:

| Binary | x | y | Cue | a | b |
|---|---|---|---|---|---|
| 1 | 1 | 0 | $+V = +1$ | $+V = 1$ | $0V = 0$ |
| 0 | 0 | 1 | $-V = -1$ | $0V = 0$ | $+V = 1$ |
| ? | 0 | 0 | $0V = 0$ | $0V = 0$ | $0V = 0$ |

The question mark in the table signifies a bit of the word to be retrieved from memory that is not known, or which does not matter. Each cue is applied to its associated pair of input conductors a and b through noninverting and inverting amplifiers A and B, respectively, to produce signals on the input conductors a and b at the 0V and $+V$ levels as indicated in the table above.

Each memory word is stored in a separate one of the matrix output conductors at the first level by connecting resistors of unit value between it and the ones of the paired input conductors a and b having a $+V$ signal for a cue word that exactly matches the word stored. In that manner, when cues of a desired word address the first level, the matrix output conductor having the most matching resistor connections will have the greatest output current. A winner-take-all circuit in the second level has a separate processor neuron for each output conductor and responds to signals on the output conductors to produce an output signal from only the one processor neuron having the greatest current input. In that manner, the first level is used to search for the stored word which most nearly matches the cues, and the second level decides which output conductor having a stored word most nearly matches.

By inverting the cues of the word sought, and inverting the inputs to the winner-take-all circuit, the search logic in the first level is inverted so that instead of searching for the greatest number of matches, the search is made for the smallest number of mismatches on a conductor to reduce the effect of resistor imprecision. With either the inverting or noninverting logic, the unary output of the winner-take-all circuit addresses a converter in the third level which outputs the full binary code of the word stored in memory which most nearly matches the cues as determined by the second level.

Instead of using noninverted binary cues with unary valued connections, it is possible to extend the same concept and architecture to analog valued cues and analog valued connections. In this case, the output conductor which receives the greatest input current is the one which has the greatest inner product between the analog vector of its conductances to the input conductors and the analog input vector. A winner-take-all circuit at the second level will now select the output conductor whose corresponding vector of connections corresponds closest in inner product to the input vector. This circuit can thus be used to select the nearest of several stored analog vectors to a particular input cue. If the stored vectors of connections are all vectors of equal length, then the stored vector which has the greatest inner product with the input vector will also be the one making the smallest angle with the input vector.

This class of feed forward neural networks for ACAMs may use sparse internal representation for the stored word, both in the first (search) level and in the third (converter) level. One way to do this is to use, instead of a unary winner-take-all circuit at the second level, an s-highest-take-all circuit which turns on the s conductors having the highest signal and suppresses the others. (The unary winner-take-all circuit is simply the special case $s=1$.) Another good way is by implementing the second (decision) level with several winner-take-all circuits serving different groups of output conductors from the first level, where the output conductors are arranged in groups. Many different groupings are possible. A particularly advantageous grouping for minimizing storage overlap is to use groups with relatively prime numbers, i.e., with the different numbers of output conductors in the groups having no common divisor, and the stored words are distributed in the memory matrix such that only one processor neuron of each winner-take-all circuit produces an output.

The advantages of this second embodiment becomes apparent when it is recognized that individual processor neurons in the different winner-take-all circuits may do multiple duty, i.e., may each respond to several cues being sought, although it is desirable to minimize this multiple duty so as to avoid interference between different words when the output of this second (decision) level is converted to a binary output. As in the first embodiment, the multiple output of the second level can be used as a pointer to recall the entire binary word using conventional recall means, but in the case of the second embodiment, each winner-take-all circuit preferably addresses a separate decoding matrix that is sharing output conductors with all other decoding matrices. Each output conductor of this third level may therefore be energized by more than one winner-take-all circuit in the second level.

The output conductors of the third level are grouped, and each group is applied to a separate winner-take-all circuit to produce a sparse code. This sparse code is then used to encode the full binary word output. Thus, in each embodiment the recall means is preferably a second matrix having input conductors connected to output conductors by connections arranged according to a coding of the words to be recalled. In the case of the sparse coding in the second embodiment, the output conductors of matrices in the third level may be grouped and connected to a plurality of winner-take-all circuits that provide a sparse output code which is then converted to a full binary output of the word being recalled. The terms input conductors and output conductors, as they relate to the matrices, refer to the parallel conductors that receive input signals and the parallel conductors which receive their currents through connections to the input conductors in order to provide output signals, respectively.

The novel features that are considered characteristic of this invention are set forth with particularity in the appended claims. The invention will best be understood from the following description when read in connection with the accompanying drawings.

DESCRIPTION OF PREFERRED EMBODIMENTS

Figure 1:
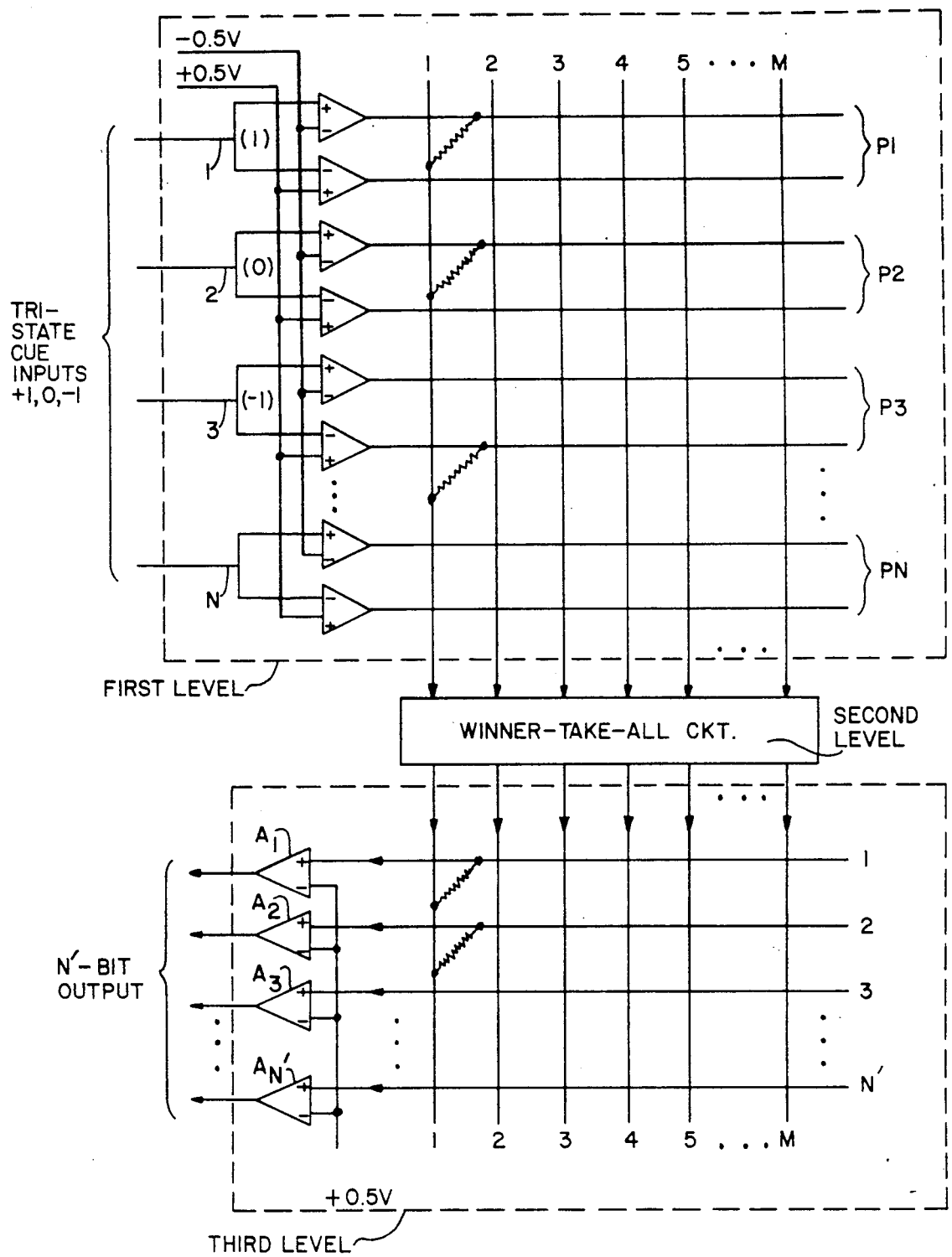
FIG. 1 illustrates the organization of a unary ACAM using tristate cues in accordance with the present invention.
Figure 2:
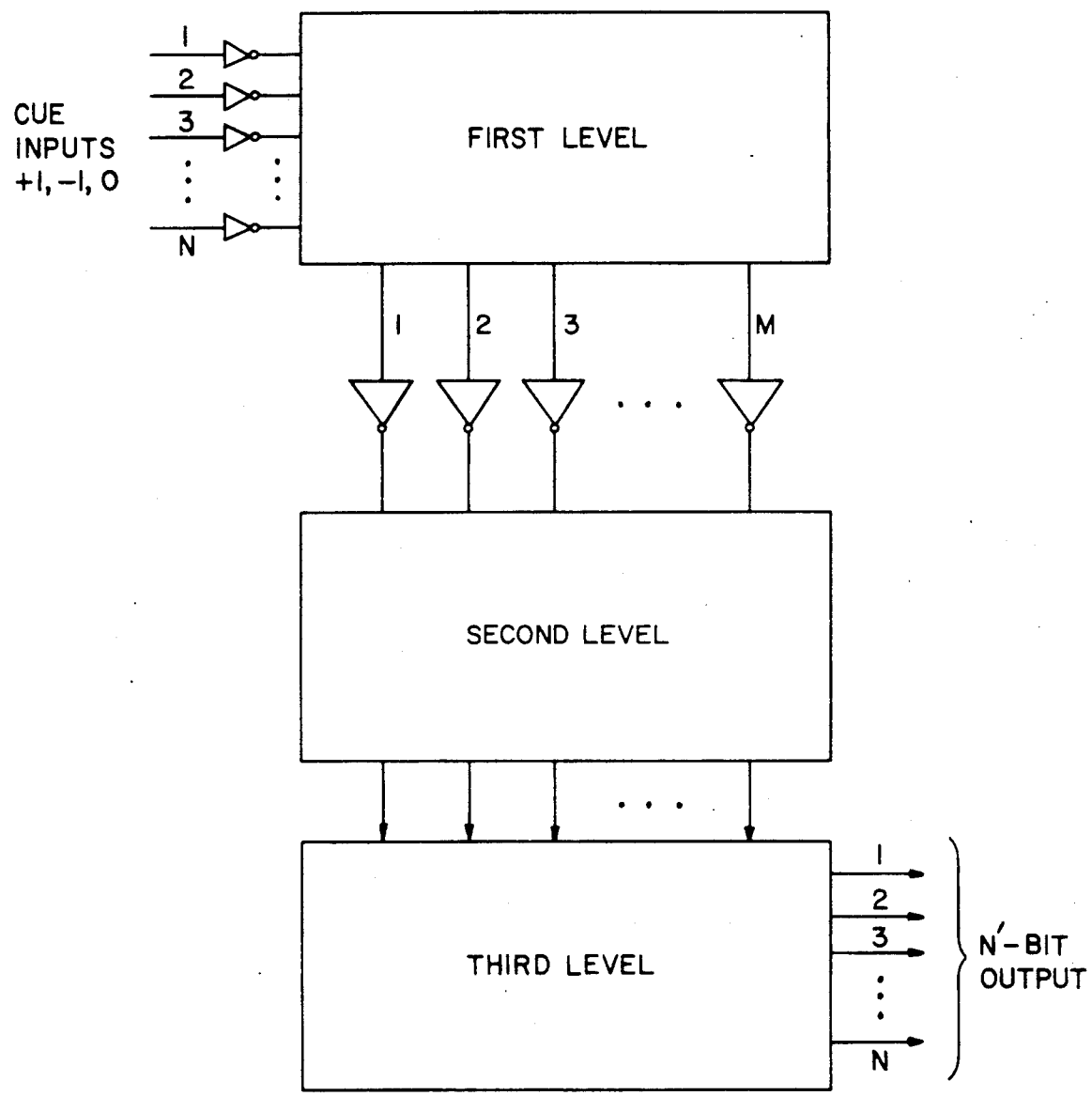
FIG. 2 illustrates a modification of the unary ACAM in which inverted logic is used to reduce the effect of resistor imprecision in the memory matrix storing words to be recalled in response to cues applied to input terminals.
Figure 3:
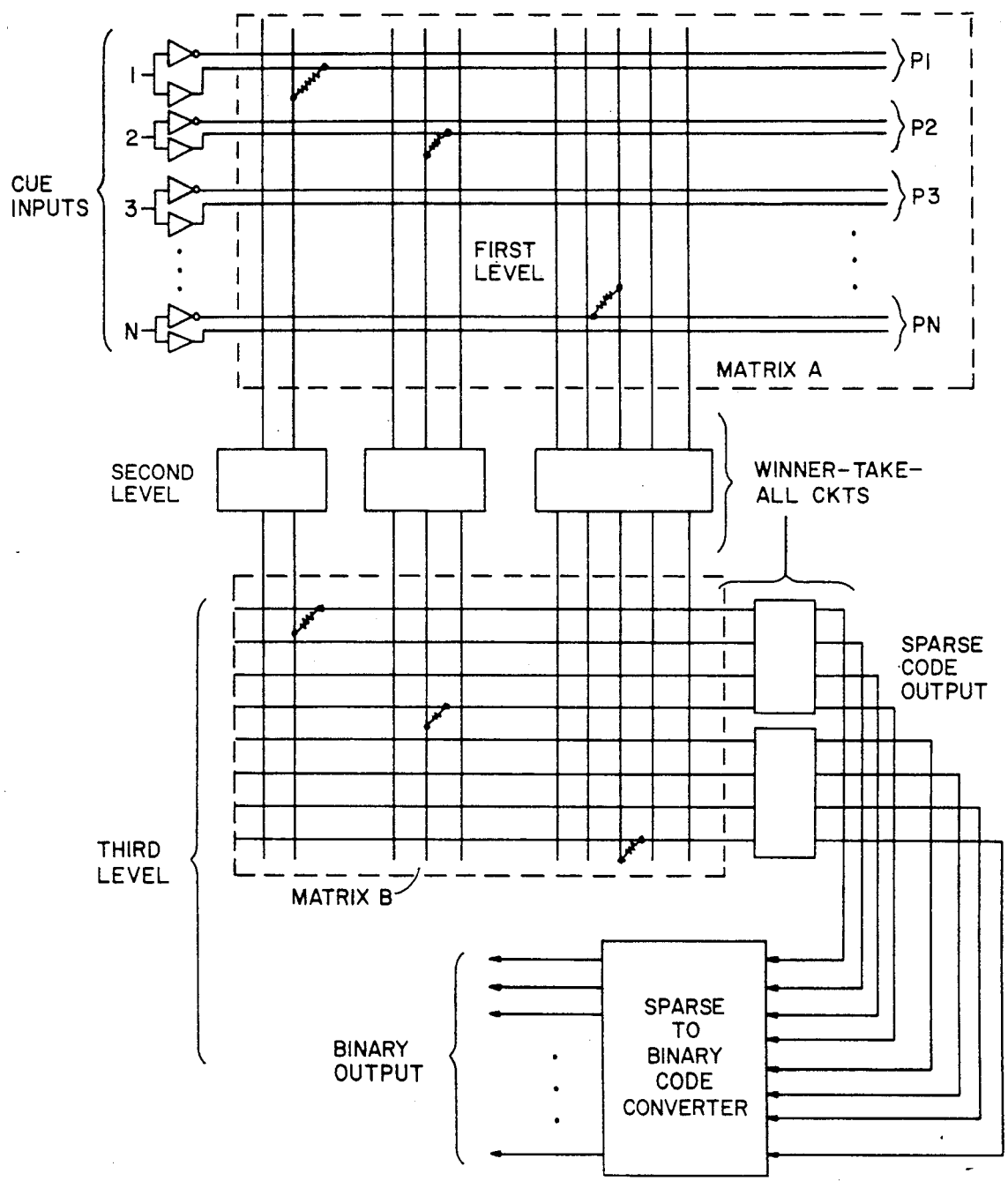
FIG. 3 illustrates yet another modification of the unary ACAM for use of the sparse internal representation of words stored.

Before describing particular embodiments of the present invention with reference to FIGS. 1, 2 and 3, it is instructive to compare the unary ACAM to the neural net ACAM described by Hopfield, John J., in Proc. Natl. Acad. Sci. 79:2554 (1982), and Proc. Natl. Acad. Sci. 81:3088 (1984). In its crudest form, Hopfield's ACAM relates output to input by $$O_j = H\left(\sum_{i,\mu} \epsilon_j^\mu \epsilon_i^\mu I_i - \theta_j\right) \qquad (7)$$
$$= H\left(\sum_{i,\mu} B_j^\mu A_\mu^{\mu i} - \theta_j\right)$$

where A and B are as defined in Eqs. (1) and (2). One arrives at this form from the unary form simply by summing over the intermediate layer—i.e., letting each neuron (grandmother cell) simply pass on its input unchanged, instead of applying a threshold. If M uncorrelated words are stored, the threshold must satisfy $$N - \frac{\alpha}{\sqrt{2}} \sqrt{(M-1)N} > \theta_j > \frac{\alpha}{\sqrt{2}} \sqrt{MN} \qquad (8)$$

in order to distinguish the 0 and 1 states with a level of confidence given by a standard deviation. The terms containing M arise because every memory, not only the desired one, contributes statistically to the sum in Eq. (7). This requirement on $\theta_j$ can be satisfied if $M<O(N)$.

Because the intermediate level in the unary ACAM does significant error-correction, it is reasonable to expect that effectively removing it, as in the Hopfield ACAM, significantly degrades both capacity and retrieval. Detailed estimates bear this expectation out. The maximum capacity of a Hopfield ACAM for error-free recall is ~N/(4 ln N) words. See McEliece, R. J., et al., "The Capacity of the Hopfield Associative Memory," IEEE Trans. Inf. Theory IT33 (1987). If 95% recall is desired, ~0.14N words may be stored. These limitations arise fundamentally from the squeezed requirements on $\theta_j$ as M increases toward N. Retrieval requires in principle at least O(N) bits. By way of comparison, with G=N intermediate neurons, the capacity of a unary ACAM is, of course, N words and retrieval requires only ~$\log_2 M$ bits.

If fanout is a problem, the unary ACAM can be used in a more modest fashion to alleviate the problem. This is because the processor neurons may be required only to drive enough neurons to distinguish a word, i.e., $\log_2 M$, which might be the first $\log_2 M$ bits, perfectly recalled. Such an output can be used as a pointer to recall the entire word, by standard recall means. The capabilities to retrieve from very partial information, and to correct errors, remain in the unary ACAM. Even more simply, the unary output of the second (grandmother) level can itself be taken as an address to recall a word from a random access memory.

The unary ACAM can be implemented in a variety of ways utilizing various technologies and data representations. The data representations include the $\{+1, -1, 0\}$ representation (Rep. 1), the $\{+1, 0\}$ representation (Rep. 2), and the $\{+1, -1\}$ representation (Rep. 3). A summary of these is given in the following table:

| REPRESENTATION VALUES TABLE | | | | |
|---|---|---|---|---|
| Logical | Binary | Rep. 1 | Rep. 2 | Rep. 3 |
| True | 1 | +1 | +1 | +1 |
| False | 0 | −1 | 0 | −1 |
| Don't know (or care) | — | 0 | 0 | ±1 (Random) |

The most desirable representation for accurate retrieval is Rep. 1, because it provides a complete representation of the logical true, logical false, and logical don't know or don't care states. Rep. 2 does not distinguish logical false from logical don't know, resulting in reduced retrieval capability. However, Rep. 2 is simpler to implement. Rep. 3 is in general the least desirable, because the don't know states result in the introduction of random noise. For these reasons, a unary ACAM which utilizes Rep. 1 will be discussed, although practical considerations may favor Rep. 2 or Rep. 3 in certain circumstances.

In the preferred embodiments, analog technology based upon resistive connections will be utilized. With this technology, multiplication is accomplished by voltage to current conversion using the equation $I=V/R$, and addition is accomplished by current summation. This basic mechanism can be used to calculate inner products or Hamming distances between input voltage arrays and corresponding resistor arrays. The details will become apparent later.

In general, and regardless of implementation technology, inner products or Hamming distances can be calculated by analog summation of match signals or mismatch signals respectively. In particular, the present state of the art favors not resistors, but rather alternative (although conceptually equivalent) implementation technologies for the calculation of matches and mismatches. For example, standard CMOS technology presently requires the use of transconductance amplifiers rather than resistors. Furthermore, certain practical circumstances may favor the use of analog/digital hybrid circuits wherein the detection of 1-bit matches or mismatches is accomplished in a digital fashion, while the summation of matching or mismatching signals (for inner product and Hamming distance, respectively) is accomplished using analog means.

For example, with data in the $\{0,1\}$ representation, matches can be calculated using not-XOR, while mismatches can be calculated using XOR. In this case, the actual connection value is stored in a memory cell. The logical element (either not XOR or XOR) then compares the value on the input conductor with the value stored in the memory cell to produce the appropriate output. This output can be used to drive the output conductor directly, or can drive a buffer amplifier which in turn drives the output conductor. The conductor then performs the analog summation. Many variations on this idea are possible, depending upon the data representation and the implementation technology.

Thus, while very specific implementations using resistors shall be presented, these ideas are easily generalizable in a very straightforward fashion to include any conceptually equivalent implementation which uses analog summation to perform inner product or Hamming distance calculations. Henceforth, we shall take the terms "resistor" and the "resistive connection" to include the possibility of using transconductances or alternative circuit elements which perform an equivalent calculational function as the resistor-based circuits presented here. We shall sometimes refer to any of these conceptually equivalent means as "connection elements" or simply "elements."

A specific implementation of the unary ACAM using resistor connections and tristate data representation (Rep. 1) from the table will now be described with reference to FIG. 1, which shows N input lines 1, 2, 3 . . . N, where N may be, for example, 32 to receive as many as 32 input cues that may have values +1, −1 or 0 to represent N bits of a word to be recalled, each cue representing a 1, 0 or "don't know," respectively, of the word to be recalled from storage. Each input line 1, 2, 3 . . . N is connected to a pair of threshold amplifiers A and B which convert the input signals to output signals on paired matrix input conductors a,b according to the following table.

| Cue Input Signal | Output a | Output b |
|---|---|---|
| +1 | 1 | 0 |
| −1 | 0 | 1 |
| 0 | 0 | 0 |

The input conductors a,b cross a number M of output conductors in the first level. Words are stored in this first level for recall by resistive connections from the paired input conductors to the output conductors, with only one separate word stored by connections to each output conductor. For example, if the first three bits of the first word stored are 1 1 0, the conductor a of the first pair P1 of conductors is connected by a unit resistor to the output conductor 1, the conductor a of the second pair P2 of conductors is connected by a resistor to the output conductor 1, and the conductor b of the third pair P3 of conductors is connected by a resistor to the output conductor 1. The paired input conductors of the matrix in this first level are similarly connected to output conductors 2 through M according to the binary digits of words 2 through M to be stored.

A word thus stored in this first operation level may be readily recalled by applying input cues to the input terminals 1, 2, 3 . . . N in the first operation level. Each of these tristate cues may be represented by two input binary bits x and y according to the following table:

| INPUT | | CUE INPUT | THRESHOLD AMP. OUTPUTS | |
|---|---|---|---|---|
| x | y | | A | B |
| 1 | 0 | +1 | 1 | 0 |
| 0 | 1 | −1 | 0 | 1 |
| 0 | 0 | 0 | 0 | 0 |

Figure 1A:
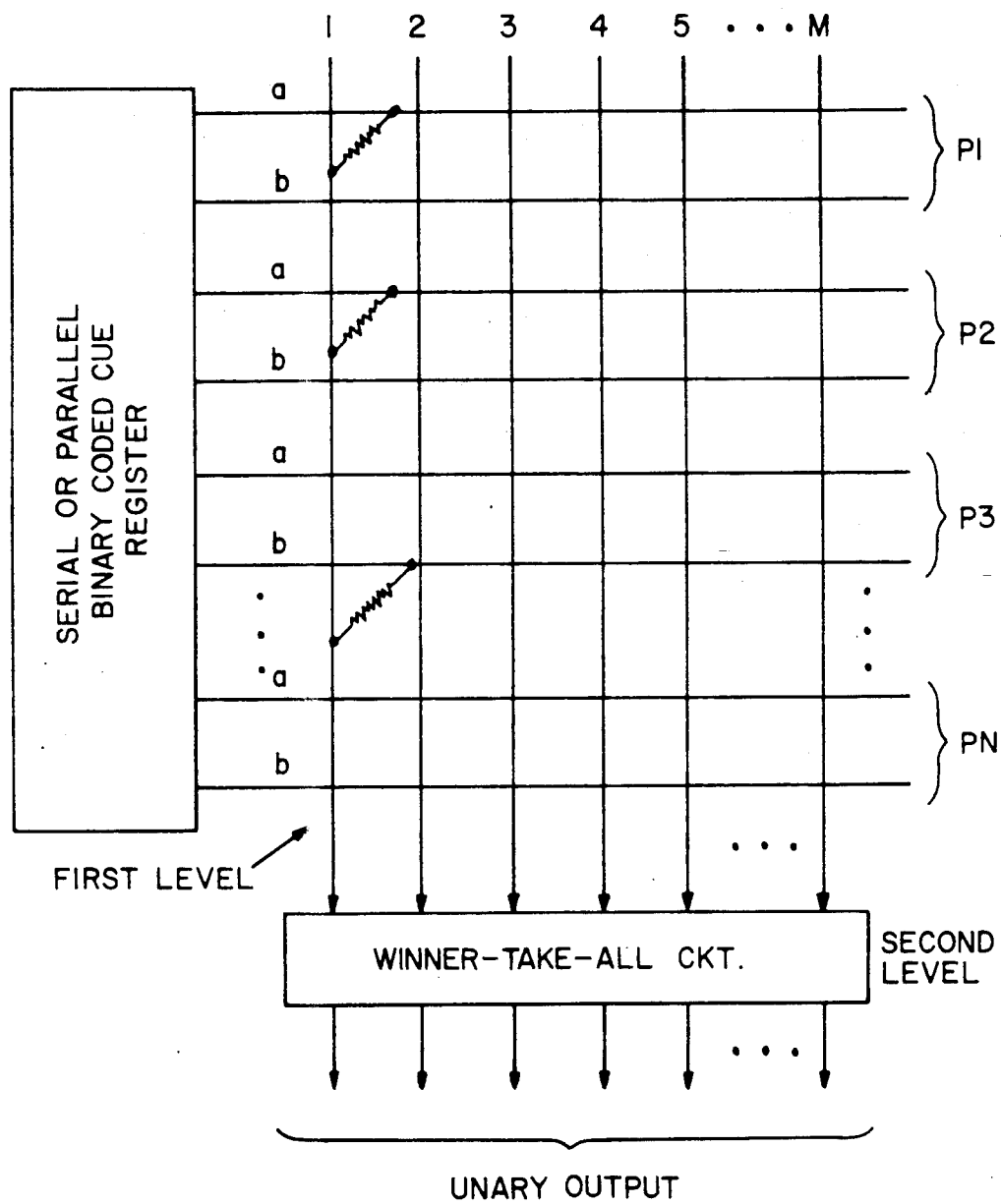
FIG. 1a illustrates a modification to FIG. 1 illustrating the use of binary x and y bits for representing each tristate code.

From this table it is readily appreciated that with a binary x,y representation of the tristate cue inputs, the threshold amplifiers may be omitted and the x and y binary signals may be applied directly to the paired a and b conductors. This can be accomplished by addressing the paired conductors directly from a binary coded cue register which receives the cue data either in parallel or in serial form, as shown in FIG. 1a. For example, if only the first and third binary digit is known, namely 1 and 0, respectively, and the second binary digit of the word is not known, the x and y inputs for the first and third digit are set to be 10 and 01, respectively, and for the second unknown binary digit of the word, the x and y inputs are set to be 00, to produce three cues set at +1, 0 and −1, respectively. This produces current in the first and third connecting resistors shown in the output conductor, but not in the second connecting resistor.

The conductance at each intersection of an input conductor with an output conductor produced by a unit resistor in the matrix of the first level of operation sums with all other conductances. Consequently, the output conductor of the matrix having the greatest current output is the one having a stored word which most closely matches the input cues. That one output conductor is identified by the winner-take-all circuit by, for example, inhibiting all other output conductors with less current, while at the same time increasing the output of the output conductor having the highest current. Such a unary output of the winner-take-all circuit in this second level will cause current to flow at intersections of an output matrix in the third level of operation through resistor connections to the energized one of output conductors through N' (where N' is not necessarily equal to N, the number of input conductor pairs) which drive output terminals through threshold amplifiers $A_1$ through $A_{N'}$. The complete binary code of the word stored in the first level is then selected by the unary output for recall through the third operation level.

The function of the unary winner-take-all operation may be implemented in any one of a variety of ways. The most widely understood is probably a ramp circuit which simply adjusts a global threshold (up or down) until exactly one unit is on. Other approaches based upon neural networks models are possible as well. See, for example, Lippman, Richard P., "An Introduction to Computing with Neural Nets," IEEE ASSP Magazine, pp 4–22, April 1987, on the topic of selecting or enhancing the input with a maximum value at page 10, et seq. See also Tank, David W. and Hopfield, John J., "Simple 'Neural' Optimization Networks: An A/D Converter, Signal Decision Circuit, and a Linear Programming Circuit," IEEE Transactions on Circuits and Systems, Vol. CAS-33, No. 5, pp 533–541 (May 1986) on the topic of the global optimum solution to a problem, of which the winner-take-all problem is but a special case.

Figure 1B:
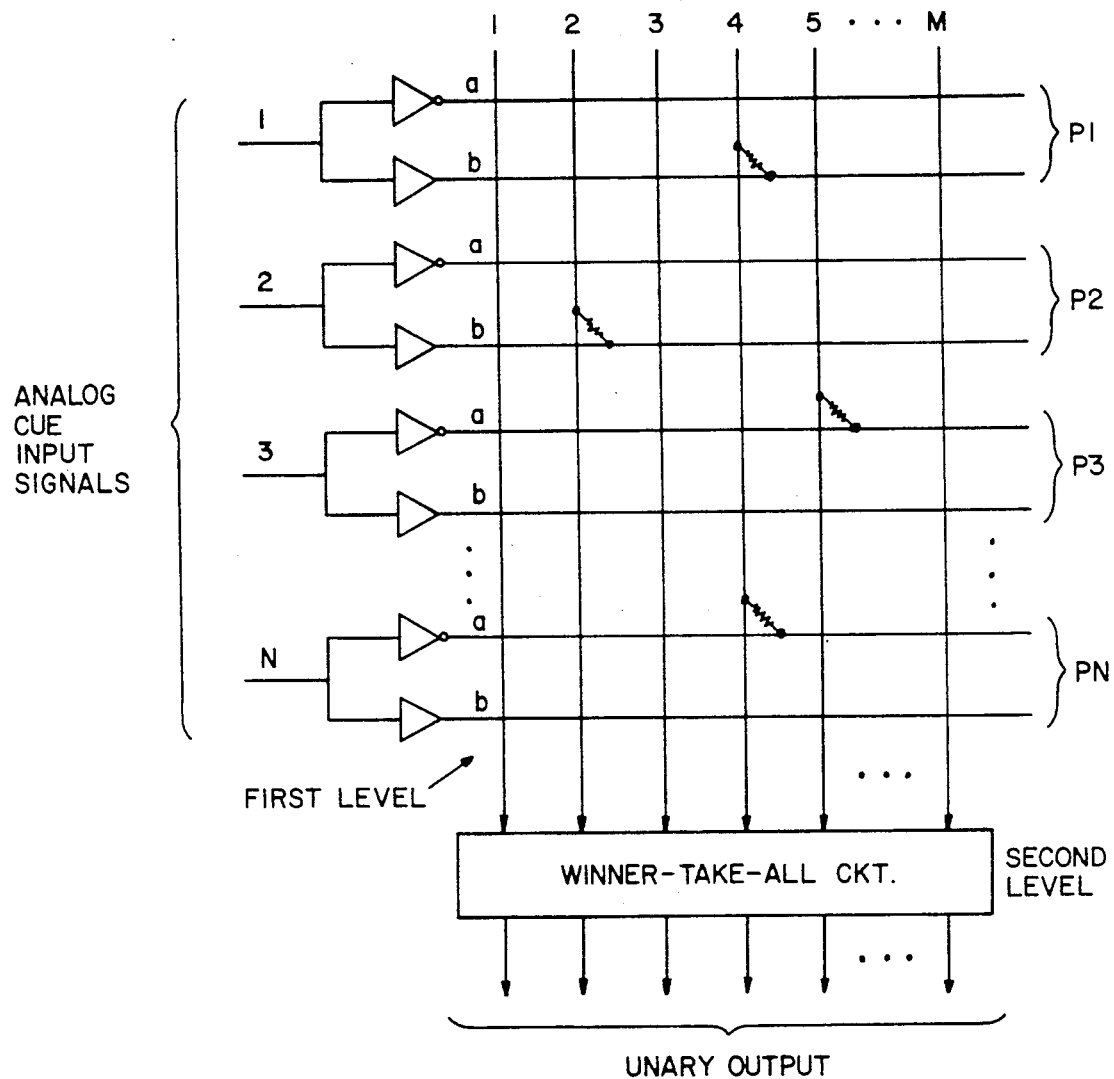
FIG. 1b illustrates a modification to FIG. 1 for receiving analog valued cues and providing output currents to a winner-take-all circuit through analog valued connections.

The notion of using current summing followed by selection of the output conductor with the highest current in order to match an input cue vector to the closest of several stored vectors can be extended into the analog domain as shown in FIG. 1b. Input cue vectors in this circuit can take on analog values, and the connection between input line i and output conductor j is implemented by a conductance $c_{ij}$ where the connection is made to the input conductor $a_i$ connected to the i-th input cue by an inverting amplifier if $c_{ij}$ is negative and to the input conductor $b_i$ connected to the i-th input cue by a noninverting amplifier if $c_{ij}$ is positive. This input connection matrix is thus similar to that described in the Hopfield U.S. Pat. No. 4,660,166. Now if the analog input vector is $I_i$, the output conductor j for which the inner product: $\Sigma_i I_i c_{ij}$ is the largest will have the largest current and be selected by the winner-take-all circuit at the second level. The output of this winner-take-all circuit is thus a unary signal encoding which of the stored vectors $c_j$ (which is to say the vector whose i-th component is $c_{ij}$) has the greatest inner product with the input cue vector. By simple trigonometry, if the vectors $c_{ij}$ are normalized, that is for all j, for some fixed c (say 1, $c = \Sigma_i c_i^2$), then the output conductor selected will be the one whose connection vector $c_j$ is closest in angle to the input vector.

Throughout the text of preferred embodiments, connections between input and output conductors are referred to as resistive connections or resistors. Actually the connections might equally be implemented with, for example, transconductance elements or indeed logical elements, which fulfill the function of transmitting a signal in a function analagous to the resistors referred to in FIG. 1. Such logical elements could use digital processing, or a hybrid of digital and analog processing to count matches, to count mismatches, or to calculate a term in an inner product which would then be summed with other such terms on a conductor.

It is recognized that if the first level stores a word of 32 bits, for example, and the resistors are not carefully matched at 1 unit each, a match of some relatively high number of cues, such as 9, in some other output conductor at the first level may exceed some larger number of cues, such as 11, of the actual word to be recalled due to the imperfection in resistors. To avoid such an error, the ACAM is preferably modified to invert the logic of the second level operation. This is done by inverting the inputs (+1 to −1 and −1 to +1) to the first level matrix, and using inverting amplifiers of unity gain to couple the first level matrix to the winner-take-all circuit of the second operation level, as shown in FIG. 2. As a consequence, the winner-take-all circuit responds to the output conductor of the first level having the lowest number of mismatches. In other words, the logic of the unary ACAM is inverted to sum up mismatches, i.e., to produce an output of the first level to the inverting amplifiers coupling a sum signal to the winner-take-all circuit. Consequently, the unary output to the third level represents the output conductor in the first level having the lowest number of mismatches. Mismatches contribute less current to the output conductor in which the word to be recalled is stored, and so imperfection in the coupling resistors in the second level will contribute less error.

Imperfections in the resistors of the third operation level can be tolerated because the output conductors 1 through N' are connected to threshold amplifiers which provide binary output signals of proper voltage levels, such as OV and +3 V. Alternatively, the third operation level may be implemented with simply a conventional read-only memory (ROM) chip, or any unary to N-bit binary code converter.

DISTRIBUTED REPRESENTATIONS

Problems of fault intolerance and fan-out can be reduced by modifying the second (intermediate) operation level to represent a word to be recalled by distributed unary outputs in response to matching cues of a stored word, as shown in FIG. 3. This is distributed, as opposed to true unary representation. Naturally, with a distributed representation, the a priori restriction $M \leq G$ no longer holds where G is the number of output conductors at the first level. Also it is not necessary to resort to inverted logic to minimize errors due to imperfections in the resistors of the first level.

A distributed ACAM is just a unary ACAM in disguise, if each processor neuron responds only to one stored word. The interesting generalization arises when processor neurons do multiple duty, responding to several stored words. On the other hand, it is desirable to enforce minimal overlap between the intermediate representation of different words, so as to minimize interference between different words when the intermediate representation is converted into the output.

The simplest sort of distributed representations are generated by connection matrices of the form $$A_j^i = \Sigma \epsilon_i^\mu D_j^\mu \tag{10}$$

where $D_j^\mu$ is a matrix of 1's and 0's. The matrix $D_j^\mu$ associates each memory (labeled by $\mu$) with a set of $s \geq 1$ internal units (labeled by j). In this sense, $D:\mu \to j$ converts a unary representation into a distributed representation. If $s < G$, the representation is sparse.

A good distributed representation minimizes the storage overlap between stored memories. A fairly good representation can be provided by associating memory $\mu$ with a randomly chosen set of s neurons in the second (intermediate) level shown in FIG. 1 and using, instead of a winner-take-all circuit at the second level, a G-choose-s circuit which chooses the set s of output conductors at the first level with the highest current and provides a high voltage on the associated input conductors at the third level, while suppressing the G-s other conductors at the third level. Such a G-choose-s (or s-highest-take-all) circuit can be implemented in ways similar to a winner-take-all (or G-choose-1) circuit. For example, this is again a special case of the linear programming circuit described in Tank, David W. and Hopfield, John J., "Simple 'Neural' Optimization Networks: An A/D Converter, Signals Decision Circuit, and a Linear Programming Circuit," IEEE Transactions on Circuits and Systems, Vol. CAS-33, No, 5, pp 533-541 (May 1986). A specific example of a $D_j^\mu$ which insures very small overlap between the (ideal) intermediate representations of different words, is the following. Let the second (intermediate) level shown in FIG. 3 be divided into groups $S_1, S_2, S_3 \ldots$, such that group $S_l$ has $P_l$ members, with the numbers $P_l$ chosen to be relative prime. Then set, in the lth group, $$D_j^\mu = \text{if } j - \sum_{k=1}^{l=1} P_k \equiv \mu (\text{mod} P_l) \tag{11}$$
$$= 0 \text{ otherwise}$$

Thus, each word stored in the matrix of the first level activates one neuron in each group. In arranging the distributed storage of words in the matrix of the first level, the position of the active neuron for each successive word stored is incremented by one within each group in passing from one word to the next. This scheme allows $P_1, P_2 \ldots P_S$ words to be stored, and the overlaps are generally quite small: two words $\mu,\nu$ overlap in two places only if some product $P_\alpha P_\beta$ divides $\mu - \nu$ in three places only if $P_\alpha P_\beta P_\gamma$ divides $\mu - \nu$, etc. Many other choices of D are possible, of course.

Considering the noise or "association error" at the first level of the network, first consider the case in which the input cue consists of b correct bits and N-b zeros. Two obvious constraints limit the number M of memory words which can be stored in the network and unambiguously recalled:

$$M \leq \binom{G}{s}$$

and $M \leq 2^b$. The reliability of recall is determined by the ability of the first level to correctly discriminate between the correct memory word and other words, given a b-bit input cue. Each internal output conductor of the first level will take part in labeling on the average Ms/G different memories. If $Ms/G \leq 1$, the memories are not really distributed. In the following discussion, assume $Ms/G > 1$, which also justifies the use of Gaussian statistics. The s internal units which label the correct memory will receive input $$b \pm \sqrt{b(Ms/G)} , \tag{12}$$

while the other G-s internal units will each receive a random noise input, $$\pm \sqrt{bMs/G} . \tag{13}$$

Correct discrimination will be possible when $$b \leq \alpha^2 4Ms/G, \tag{14}$$

where $\alpha$ is the signal to noise ratio and represents the number of standard deviations needed for a desired level of confidence at the internal layer. In specific cases (see below) it may be advantageous to have different probabilities for mistaking a 1 for a 0 versus mistaking a 0 for a 1. In particular, since each "on" cell in the distributed layer contributes a large coherent output for the next layer, it is very important that a high proportion of the correct "on" cells actually fire. To enforce this, lower the threshold, say to $\rho b$. Eq. (14) can still be used, with the interpretation that the confidence levels against $1 \to 0, 0 \to 1$ errors are $4\rho^2\alpha$, $4(1-\rho)^2\alpha$, respectively, where $0 \leq \rho \leq 1$. For simplicity in presentation we have mostly let $\rho = \frac{1}{2}$ in the text, but the freedom to choose it is very important for achieving optimum performance.

These estimates are based on uncorrelated words. In a large set of random words, pairs of words which agree on many bits will, as we have seen before, inevitably occur. This consideration led to Eq. (5). A conservative procedure which takes this effect into account is simply to add the two sources of noise, thus:

$$b \geq \log_2 M + \log_2 1/\epsilon + 2\alpha \sqrt{bMs/G},\qquad(15)$$

which must be solved implicitly for b. It is clear that retrieval requires less information for smaller s.

Use of the distributed representation will require that the number of correctly firing winner-take-all circuits $S_1, S_2, S_3, \ldots$ not be overwhelmed by rare fluctuations which exceed threshold among the much larger population G.

In the interesting limit where G > s and the error rate $$\lambda = 1 - \text{normal}(\alpha) \approx \frac{1}{\sqrt{2\mu}} e^{-\alpha^2/2}$$

is very small, so $\lambda G < S$, the frequency of processor neuron errors is described by Poisson statistics. The means number of incorrectly active processor neurons is $\mu = \lambda G$ with variance $\sigma^2 = \mu$. As explained below, a number of errors $\mu$ even greater than s can be tolerable; however, a conservative limit might be, for example $$\mu + 3\sqrt{\mu} \leq s \qquad(16)$$

This is readily achieved for modest values of $$\alpha \sim O(\sqrt{\log G/s}) \qquad(17)$$

A simple choice of connection matrix B is $$B_k{}^j = \sum_\mu D_j{}^\mu \epsilon_k{}^\mu \qquad(18)$$

The prescription here is to add a unit of strength to the j→k connection for each memory $\mu$ which both ideally fires intermediate cell j and has a 1 for its kth digit. With this choice, the reliability analysis for the output layer parallels that for the input layer.

Consider the case where s correct internal units plus an additional $\mu$ incorrect units are active. If we consider an output unit for which the correct response is say 1, the input to that unit will be s plus an incoherent sum of $(s+\mu)Ms/G$ components from other vectors:

$$s \pm \sqrt{(s+\mu)Ms/G}. \qquad(19)$$

This yields the capacity constraint:

$$\frac{M}{G} \leq \frac{1}{\beta^2} \frac{s}{s+\mu}. \qquad(20)$$

Here, $\beta$ is the signal to noise ratio required at the output layer. Consequently no more than G memories can be stored in the network, and if $\mu << s$, and reliable recall is desired, say 95% requiring $\beta = 1.6$, then 0.4 G memories can be stored. For $\mu = s$, a significant error rate at the processing layer, the capacity is only reduced by an additional factor of 2. For perfect recall, it is necessary that none of N output bits be erroneous; this requires $\beta^2 \leq 21$ nN.

SPARSITY

It may be disappointing that $M \leq G$ for this type of distributed memory, but it should not be surprising. The unary representation saturated the limit on stored bits per synapse, and no new synapses have been added. The distributed representation requires synapses capable of more than two states; but the added information per synapse has brought redundancy: fault tolerance rather than capacity. The potential capacity $M/G >> 1$ for distributed representations has not yet been exploited. This potential can be exploited when the words to be stored are sparse, that is contain many fewer 1s than 0s. (In this section, a {0,1} representation is used.)

The sparsity of data is parametrized by $\chi = c/N$, where $c << N/2$ is the number of 1s in each N-bit word. A noise analysis for the input stage similar to the above leads to the retrieval constraint $$b \geq 2\alpha \sqrt{\chi(1-\chi)Ms/G}. \qquad(21)$$

Since $\chi$ is the probability of having a 1 in any given place, the probability that a random word has all 1s in b prescribed places is $\chi^b$. Requiring that M times this probability is less than $\epsilon$, results in $$b \leq (\log_2 M/\epsilon)/(\log_2 1/\chi). \qquad(22)$$

The appearance of the factor $\log_2(1/\chi)$ is related to the fact that a sparse word of length N contains $N\chi\log_2(1/\chi)$ bits of information, even though it has only $c = \chi N$ 1s. A conservative estimate of retrieval is obtained by requiring that b exceed the sum of the right-hand sides of Eqs. (19) and (20).

The noise analysis for the output stage yields the capacity constraint $$\frac{M}{G} \leq \frac{1}{4\chi(1-\chi)} \left(\frac{s}{s+\mu}\right) \frac{1}{\beta^2} \qquad(23)$$

Evidently, $M/G >> 1$ can be attained only for sparsity $\chi << 1$.

It is instructive to discuss distributed memory for sparse data from the point of view of device efficiency and information theory. To achieve optimum information storage efficiency, one would like to maximize the synaptic information content. In situations where unary cells are expensive but synapses are cheap (as may be the case in biology), it is desirable to maximize the information stored per cell, even at the cost of introducing additional connections.

The storage efficiency of synapses will be considered first. Let there be M stored words, each with information content $N\chi\log_2 1/\chi$. On the other hand there are GN synapses. Each will be written on of order $sM\chi/G$ times, so a dynamic range of this order (more precisely, its square root) is required for the synapses. This requires $\log_2 sM\chi/G$ bits per synapse. The efficiency, defined as the ratio of information content to maximal information in the hardware, is $$E = \frac{M}{G} \frac{\chi \log 1/\chi}{\log sM\chi/G}. \qquad(24)$$

General considerations of course constrain $E \lesssim 1$. How does this compare to the bounds desired from our noise analysis? Since $\beta^2 \gtrsim \log N \gtrsim \log 1/\chi$ for perfect recall, the constraint from output noise [Eq. (21)] does insure $E \lesssim 1$.

The best efficiency for given M/G is achieved when $sM\chi/G \lesssim 1$, there is no gain from larger s. When $sM\chi/G \lesssim 1$, it is easy to show that few synapses are written on more than once. In this case it is possible (and very desirable) to work with binary synapses. A network with binary synapses clearly reaches its maximal capacity when about half the synapses are written, $sM\chi/G \lesssim \frac{1}{2}$. Given the previous constraint, this is automatic when $s \lesssim \log 1/\chi$; more highly distributed representations sacrifice capacity.

The advantages of sparsity for cell efficiency (i.e., to achieve $M/G \gg 1$) are so great that it can be useful to artificially "sparsify" data or responses which are not sparse to begin with.

SPARSIFICATION

The most obvious way to sparsify data is to divide the output conductors of the third level matrix into groups, such as groups of four, and represent each in a unary form. For instance, a group of four bits can be represented by $2^4 = 16$ lines, exactly one of which corresponds to each possible word in the group. This grouping achieves sparseness $\chi = 1/16$.

This simple sparsification schemem appears to be fully adequate at the output stage, and allows the output noise to be reduced—at the cost of more connections—in a universal fashion. It is worth considering other techniques for the input of an associative memory, however, because a single error anywhere in a group leads to an entirely erroneous representation.

Indeed, sparsification of input data in the first level appears to require very different and much less trivial methods. One approach involves the use of feature detectors. In this approach, one has a layer of processor neurons immediately following the input, which respond to local features of the words in sparse fashion. For example, one might have feature detector neurons which look at some 32-bit sample of the word and fire only when at least 24 of the bits are 1s. This corresponds to a $3\sigma$ deviation, so an assembly of such detectors will give sparseness $\chi \simeq 10^{-3}$. The sparse words generated at the feature level can then be regarded as input for an error-correcting distributed intermediate winner-take-all level, much as before.

The retrieval capabilities of the feature-detecting layer are, unfortunately, quite modest, particularly for truly random words. While a full mathematical investigation is quite complicated, the basic reason for this is easy to state. That is if some fraction of the digits in a feature with more than its statistical share of ones are randomly obliterated, the resulting shortened feature is likely to regress toward the mean. If half the digits in a large $3\sigma$ feature are obliterated, the shortened feature has only ~6% chance of remaining a $3\sigma$ feature. So unless a substantial fraction of the N-bits input is correctly given, the fraction of correct bits at the feature level will be very small. Nevertheless, it is quite possible to recover a memory accurately even from a very noisy intermediate representation. It is interesting to note that the statistics works favorably for features containing a small number of bits.

The quest for large capacity thus leads to an ACAM in which a binary to sparse code converter is appended at the input of the circuit FIG. 3, and the words to be stored are first sparsified, then stored; and the circuit in retrieval first sparsifies the input cue, then retrieves a sparse, stored word. Finally, the sparse word retrieved is converted back to a binary output.

The information-theoretic logic behind the appearance of extra levels is worth remarking. The one-layer architecture only allows a number of synapses proportional to G, so the storage capacity, although optimal for the number of synapses, is small per cell. Having two or more large levels of matrices, highly interconnected with one another, allows many more synapses and hence more capacity.

What is claimed is:

1. An associative content addressable memory comprising a matrix of input and output conductors, and means for making connections from input conductors to output conductors, thereby storing vectors of information on each output conductor, each vector stored being defined by a pattern of connection elements from said input conductors to one of said output conductors, means for applying cue signals to input conductors corresponding to as many signals as are known of a pattern of a vector sought to be recovered from said matrix, thereby producing on each output conductor an analog summation signal having an amplitude corresponding to the number of cues matched, unary output means responsive to said output signals of all output conductors for producing a single output signal on one terminal of an array of output terminals, whereby said one output terminal corresponds to the output conductor having the largest number of cues matched, and means responsive to each of said single output signals for converting each of said single output signals as they occur to a desired code of the vector recalled from storage in said matrix of conductors corresponding to each of said single output signals.

2. An associative content addressable memory as defined in claim 1 further comprising separate means for inverting each cue input to said matrix, and separate means for inverting each of said signals of said output conductors to which said unary output means responds, thereby inverting the logic of said associative content addressable memory in producing a single output signal indicative of the vector stored by looking for the largest number of mismatches between inverted cues and said connections from input conductors to output conductors in order to minimize the effect of variation in conductance by said connections between said input and output conductors.

3. An associative content addressable memory comprising a matrix of input and output conductors, and means for making selected connections from input conductors to output conductors for storing vectors of information, each vector stored being defined by a pattern of connections from said input conductors to said output conductors, wherein said matrix of input and output conductors employs distributed representations of the form $$A_i^j = \Sigma_\mu \epsilon_i^\mu D_j^\mu$$

where $\epsilon_i{}^\mu$ is said matrix of conductors and connections for storing said vectors of information, and $D_j{}^\mu$ is a matrix of 1's and 0's which associates each memory labeled by $\mu$ with a set of $s \geq 1$ output conductors labeled by j, whereby $D: \mu \rightarrow j$ converts a unary representation of a vector into a distributed signal set representation, means for applying a group of cue signals to input conductors corresponding to as many cue signals as are known of a pattern of signals of a vector sought to be recovered from said matrix, thereby producing on each output conductor an analog summation signal having an amplitude corresponding to the number of known cue signals matched with said connections from said input conductors to said output conductors, means responsive to said output signals of all output conductors for producing output signals on s terminals of an array of output terminals, said s output terminals corresponding to the output conductors having the largest innerproduct with a vector of cue signals, and means responsive to said output signals on s terminals for converting said output signals to a binary code of the stored vector having the largest innerproduct of said cue signals with a stored vector, said means being a matrix of conductive connections between input and output conductors of the form $$B_k{}^j = \Sigma_\mu D_j{}^\mu \epsilon_k{}^\mu.$$

4. An associative content addressable memory as defined in claim 3 wherein said means for producing output signals on s terminals of an array of output terminals comprises a plurality of winner-take-all circuits connected to said output conductors.

5. An associative content addressable memory, as defined in claim 4 wherein each winner-take-all circuit has a different number of input and output signal terminals, where said number is relatively prime to the numbers of other winner-take-all circuits.

6. An associative content addressable memory as defined in claim 3, wherein said means responsive to said output signals on s terminals for converting said output signals to a binary code of the stored vector having the largest innerproduct of said cue signals with a stored vector comprises a matrix of conductive connections of input to output conductors, a plurality of winner-take-all circuits connected to said output conductors for producing a sparse code, and a means for converting said sparse code to a binary code.

7. An associative content addressable memory for finding the best match to a cue word of binary input signals from amongst a set of binary coded words stored comprising a matrix of input and output conductors, and means for making connections from selected input conductors to selected output conductors for storing said binary coded words separately on said output conductors, each binary word stored being defined by a binary word pattern of connections from said input conductors to an output conductor, means for applying binary signals to input conductors as an input cue word, unary output means responsive to said output signals of all output conductors for producing a single output signal on one terminal of an array of output terminals, said single output signal at one terminal corresponding to the output conductor having the largest inner product between its stored binary word and said cue word of binary input signals, and means responsive to said single output signal for converting said single output signal to a binary code of the word recalled from storage in said matrix of conductors corresponding to said single output signal.

8. An associative content addressable memory for finding the best match from amongst a stored set of analog vectors to an analog input cue vector comprising a matrix of input and output conductors and means for making connections from selected input conductors to selected output conductors to define stored vectors, one vector for each output conductor, thereby storing a separate analog vector on each output conductor, each analog vector thus stored being defined by the analog vector of said connections of an output conductor to said input conductors, means for applying analog signals to said input conductors defining an input cue vector, and means responsive to said output signals of all output conductors for producing a single output signal on one terminal of an array of output terminals, whereby said single output signal at one terminal corresponds to the output conductor having the largest inner product between its stored vector of connections to said input conductors and said analog input cue vector.

9. An associative content addressable memory storing N-bit words for recall in response to cue signals having values +1, −1 and 0 representing binary 1, binary 0, and not known, respectively, comprising a first level matrix comprising an array of N paired input conductors a and b, one pair for each of N cue signals representing bits known of an N-bit word stored, an array of M output conductors, one for each of M words stored, means for connecting said input conductor a of each pair of input conductors to an output conductor to store a bit 1 of a word according to the position of the bit 1 in the word stored and the position of the word in the array of M output conductors, and means for connecting said input conductor b of each pair of input conductors to an output conductor to store a bit 0 of a word according to the position of the bit 0 in the word stored and the position of the word in the array of M output conductors, and noninverting means for coupling each cue input signal to its corresponding a input conductor and inverting means for coupling each cue input signal to its corresponding b input conductor, whereby input conductor a receives a +1 level signal when the cue is +1 and a 0 level signal when the cue is −1, input conductor b receives a 0 level signal when the cue is +1 and a +1 level signal when the cue is −1, and both input conductors a and b receive a 0 level signal when the cue is not known, a third level matrix comprising an array of M input conductors, each input conductor corresponding to a different one of said output conductors of said first level matrix, an array of N output conductors one for each bit of said N-bit words stored, a separate resistor connecting selected ones of said output conductors to selected input conductors of said third level matrix to store bit 1's of a binary word to be recalled upon selectively energizing one of said input conductors, and means at a level intermediate said first and third levels for selecting from said output conductors of said first level matrix one output conductor having the greatest current sum among all output conductors from all resistors connected thereto, and energizing a corresponding input conductor of said third level matrix.

10. An associative content addressable memory as defined in claim 9 including means for inverting each cue input to said first level matrix, and means for inverting signals of output conductors of said first level matrix, thereby inverting the logic of said first level matrix in cooperation with said means for selecting and energizing an input conductor of said third level matrix to search for the output conductor of said first level matrix having the least number of mismatches between cues and words stored by connections of said resistors to said output conductors of said first level matrix.

11. An associative content addressable memory as defined in claim 10 including a separate threshold amplifier connected to each output conductor of said third level matrix to convert each unary output signal coupled thereto to a predetermined increase of voltage from a reference level for defining a bit 1, while each output conductor not having a signal coupled thereto remains at said predetermined reference voltage level.

* * * * *